United States Patent [19]

Higuchi et al.

[11] Patent Number: 5,653,344
[45] Date of Patent: Aug. 5, 1997

[54] ELECTRONIC PARTS STORAGE CASSETTE

[75] Inventors: Hirokazu Higuchi, Moriyama; Keiichi Shimamaki, Shiga-ken, both of Japan

[73] Assignee: Murata Manufacturing Co., Ltd., Japan

[21] Appl. No.: 551,652

[22] Filed: Nov. 1, 1995

[30] Foreign Application Priority Data

Nov. 4, 1994 [JP] Japan .................................... 6-271470

[51] Int. Cl.$^6$ .................. B65D 73/02; B65D 43/04
[52] U.S. Cl. .................. 206/721; 206/714; 206/716; 206/723; 229/221
[58] Field of Search .................. 206/701, 713–714, 206/716, 721–723, 328, 329, 334; 229/210, 221, 223, 229

[56] References Cited

U.S. PATENT DOCUMENTS 4,770,565  9/1988  Upton .
4,846,347  7/1989  Schulze-Kahleyss .

FOREIGN PATENT DOCUMENTS

| 0279754 | 2/1988 | European Pat. Off. . |
| 096925 | 4/1987 | Japan .................................... 206/701 |
| 620910 | 6/1994 | Japan .................................... 206/701 |
| 1185466 | 9/1967 | United Kingdom . |
| 1325232 | 7/1971 | United Kingdom . |
| 1420494 | 3/1973 | United Kingdom . |
| 1604694 | 3/1978 | United Kingdom . |
| 2030544 | 4/1980 | United Kingdom . |
| 2112753 | 12/1982 | United Kingdom . |

OTHER PUBLICATIONS

United Kingdom Search Report dated Nov. 29, 1995.

*Primary Examiner*—Paul T. Sewell
*Assistant Examiner*—Luan K. Bui
*Attorney, Agent, or Firm*—Ostrolenk, Faber, Gerb & Soffen, LLP

[57] ABSTRACT

An electronic parts storage cassette for supplying a plurality of electronic parts to a mounting machine includes a plurality of electronic parts contained in a case body member for storing the electronic parts and an adaptor member to be attached to the mounting machine. The case body member may be formed of a disposable sheet material such as paper.

22 Claims, 4 Drawing Sheets

ELECTRONIC PARTS STORAGE CASSETTE

BACKGROUND OF THE INVENTION

1. Field of the Invention

This invention relates to an electronic parts storage cassette which is adapted for storing a plurality of electronic parts in a case and which is used for supplying a plurality of electronic parts to a mounting machine for mounting electronic parts, and more particularly to an improvement in the structure of the case.

2. Description of the Related Art

An electronic parts storage cassette which is of background interest is disclosed, for example, in Japanese Patent Publication No. 6-20910. FIG. 7 is a perspective view showing such a conventional electronic parts storage cassette.

Referring to FIG. 7, an electronic parts storage cassette 1 includes a case 2 which is formed, for example, of resin. The case 2 is preferably transparent. A storage space is formed inside of the case 2 in which a plurality of, for example, chip-type (leadless) electronic parts are stored. A discharge port 3 for discharging these electronic parts is provided in the case 2 so as to communicate with the storage space.

The discharge port 3 can be closed and opened by means of a cover (not shown) contained in the case 2. The cover is formed of a flexible plate, and arranged to be slidable between the discharge port 3 and the top surface of the case 2. An open/close operating member 4 for opening and closing the cover is located on the top surface of the case 2. The open/close operating member 4 reciprocates within a recessed portion 5, and the cover is opened and closed in accordance with the reciprocating motion of the open/close operating member 4.

Referring to FIG. 8, the cassette 1 constituted as described above is removably attached to a hopper 6 provided on the mounting machine in order to supply a plurality of electronic parts to the mounting machine. As shown, the above-mentioned electronic parts 7 are contained in a storage space 8 formed inside of the case 2. The cassette 1 is attached to the hopper 6 with the discharge port 3 directed to the hopper 6.

To enable such attachment as described above, the case 2 of the cassette 1 includes an attaching portion 9 at the end portion thereof where the discharge port 3 is formed. The attaching portion 9 is provided with a pair of ribs 10 (only one rib is shown in FIG. 7). On the other hand, the hopper 6 is provided with a fitting portion 11, only a portion of which is shown in FIG. 8. When the ribs 10 are slidably fitted to grooves (not shown) provided in the fitting portion 11, the cassette 1 is attached to the hopper 6.

When the cassette 1 is attached to the hopper 6 as described above, the discharge port 3 is directed downward with the cassette 1 inclined at about 45 degrees. After the attachment of the cassette 1 to the hopper 6 in this way, the open/close operating member 4 is operated to open the lid. This allows the electronic parts to pass through the discharge port 3 to be temporarily held in a reserve space 12 formed in the hopper 6. Communicating with the lower end portion of the reserve space 12, an alignment passage 13 is provided. The alignment passage 13 performs the function of aligning the electronic parts in a row while directing them toward a predetermined direction.

The electronic parts 7 discharged out of the alignment passage 13 of the hopper 6 are directed toward a fixed direction. The electronic parts 7 are transported onto a suitable circuit board while being held by a vacuum suction chuck (not shown) and then, mounted on the circuit board.

The above-mentioned electronic parts storage cassette 1 is shipped from a parts manufacturer to an assembly manufacturer with the electronic parts stored therein. At the assembly manufacturer's end, the cassette 1 is attached to the hopper 6 or the like which is connected to the mounting machine so as to supply electronic parts 7 to the mounting machine. After the complete discharge of the electronic parts, the cassette 1 is removed from the hopper 6, and the attachment of another cassette 1 to the hopper 6 is repeated. Since the case 2 is relatively expensive, and causes environmental issues when disposed of by burning or the like, the case 2 is usually returned to the parts manufacturer after use for the purpose of being refilled and used repeatedly.

However, when the case 2 is repeatedly used as described above, not only is costly transportation required from the parts manufacturer to the assembly manufacturer but also from the assembly manufacturer to the parts manufacturer. Thus, the repeated use of the case 2 is a factor preventing the cost-reduction of the electronic parts storage cassette 1 itself. Particularly, when the electronic parts storage cassette 1 is shipped abroad, the cost of transportation for returning the case becomes prohibitively expensive. Thus, the case 2 is not returned from abroad frequently.

SUMMARY OF THE INVENTION

It is an advantageous feature of the present invention to provide an electronic parts storage cassette which can solve the above-mentioned problems.

According to a broad aspect of the invention, an electronic parts storage cassette for supplying a plurality of electronic parts to a mounting machine for mounting the electronic parts comprises a case including a storage space formed inside thereof for storing the plurality of electronic parts, a discharge port in communication with the storage space for discharging the electronic parts, and an attaching portion for removably attaching the case to the mounting machine with the discharge port directed toward the mounting machine.

In order to solve the above-mentioned technological problems, the case can be further divided into a case body member providing the storage space and an adaptor member providing the discharge port and the attaching portion.

A combination of each of the above-described elements with a plurality of electronic parts is also within the scope of the invention.

The case body member is advantageously formed of a sheet material and has an opening at one end portion thereof. On the other hand, the adaptor member includes a socket portion for receiving the end portion of the case body member where the opening is formed so that the opening communicates with the discharge port.

Paper is preferably used as a sheet material for forming the above-mentioned case body member.

This invention is also directed to the case body member and the adaptor member, per se, which together are comprised in the above-mentioned electronic parts storage cassette.

With an electronic parts storage cassette within the contemplation of this invention, a plurality of electronic parts can be supplied from the case body member to the mounting machine through the adaptor member by inserting the end portion of the case body member into the socket portion of the adaptor member while attaching the adaptor member to the mounting machine. The case body member is removed from the adaptor member after the discharge of the electronic parts is completed, and another case body member storing electronic parts is inserted into the adaptor member.

Therefore, with an electronic parts storage cassette within the scope of this invention, assembly manufacturers only need to receive the case body member storing the electronic parts from parts manufacturers while retaining the adaptor member for re-use. Since the case body member is formed of paper, for example, it is cheap and can be thrown away after the discharge of the electronic parts is completed. Therefore, the case body member is particularly useful for shipping the electronic parts abroad. In addition, since the sheet material is a material such as paper which does not cause environmental issues even when it is burnt, the case body member can be burnt without causing any problems after it is thrown away.

Furthermore, since the disclosed case body member performs the functions of the conventional electronic parts storage cassette without requiring a discharge port and an attaching portion, it is smaller in bulk and weight as compared with the conventional electronic parts storage cassette. Therefore, a reduction in the cost of transportation can also be expected. The disclosed case body member may also be used repeatedly for additional savings.

Still further, the adaptor member disclosed herein includes an attaching member for removably attaching the cassette to the mounting machine. Since the structure of the attaching portion of the adaptor member is like the structure of the attaching portion of the conventional electronic parts storage cassette, the electronic parts storage cassette according to this invention can be used with the conventional mounting machine without requiring any design changes.

Other features and advantages of the present invention will become apparent from the following description of the invention which refers to the accompanying drawings.

DETAILED DESCRIPTION OF EMBODIMENTS
OF THE INVENTION

Figure 1:
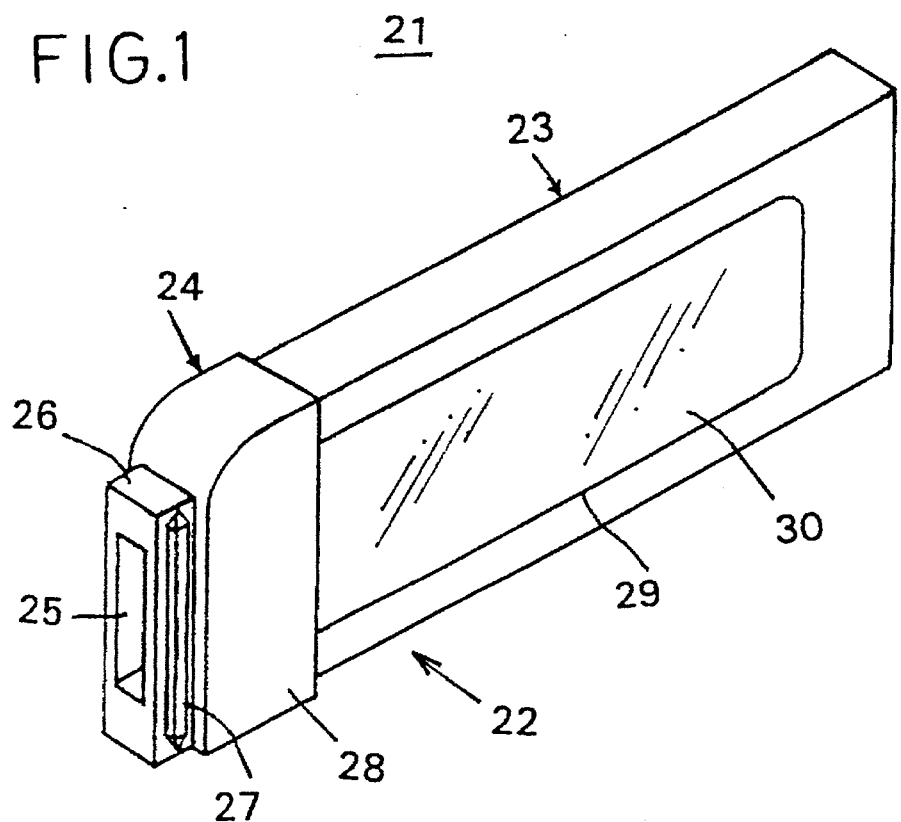
FIG. 1 is a perspective view showing the appearance of an electronic parts storage cassette according to an embodiment of the present invention.
Figure 2:
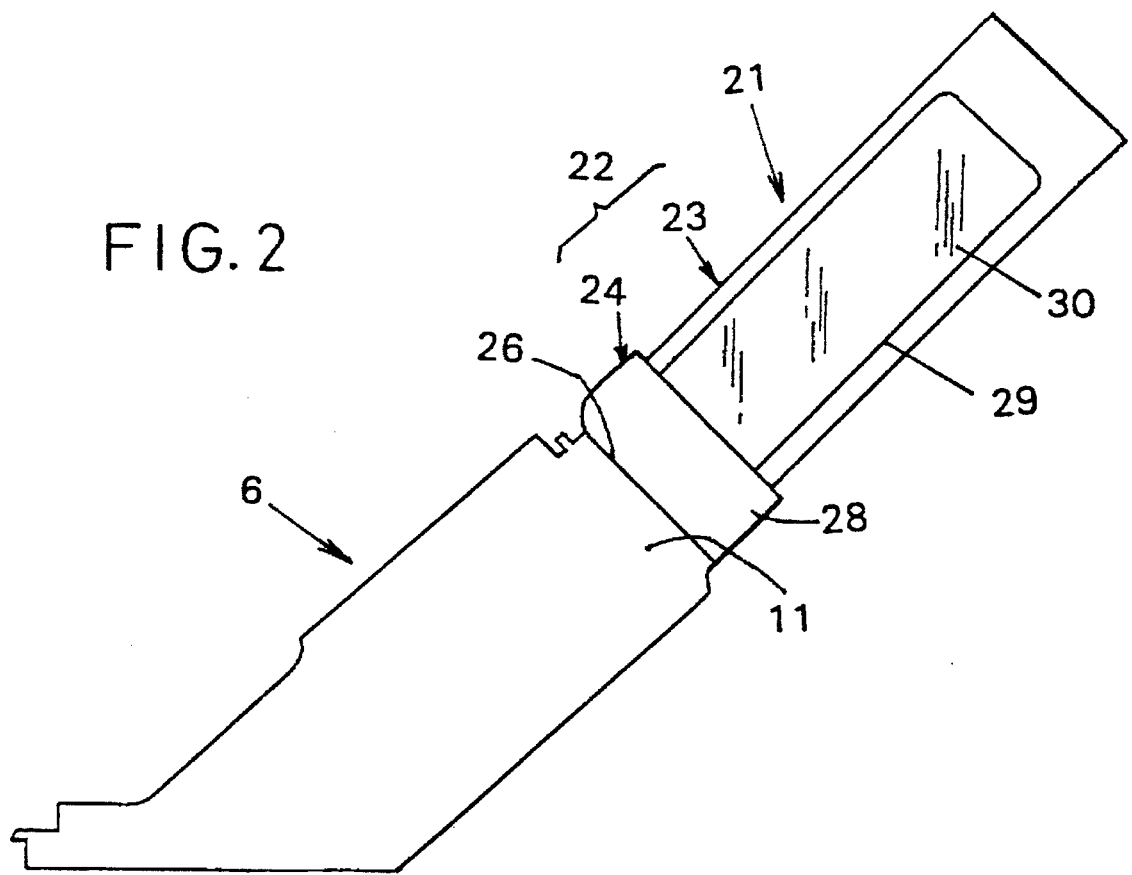
FIG. 2 is a front view showing the electronic parts storage cassette shown in FIG. 1 attached to a hopper of a mounting machine.

FIG. 1 is a perspective view showing the appearance of an electronic parts storage cassette 21 according to a first embodiment of the present invention. As shown in FIG. 2, the cassette 21 can be used by being attached to the hopper 6 of the mounting machine, similar to the conventional cassette 1.

The cassette 21 contains a plurality of, for example, chip-type electronic parts (not shown). A case 22 has a storage space formed inside thereof for storing these electronic parts. The case 22 can be divided into a case body member 23 which is shown in FIG. 3 and an adaptor member 24.

Figure 7:
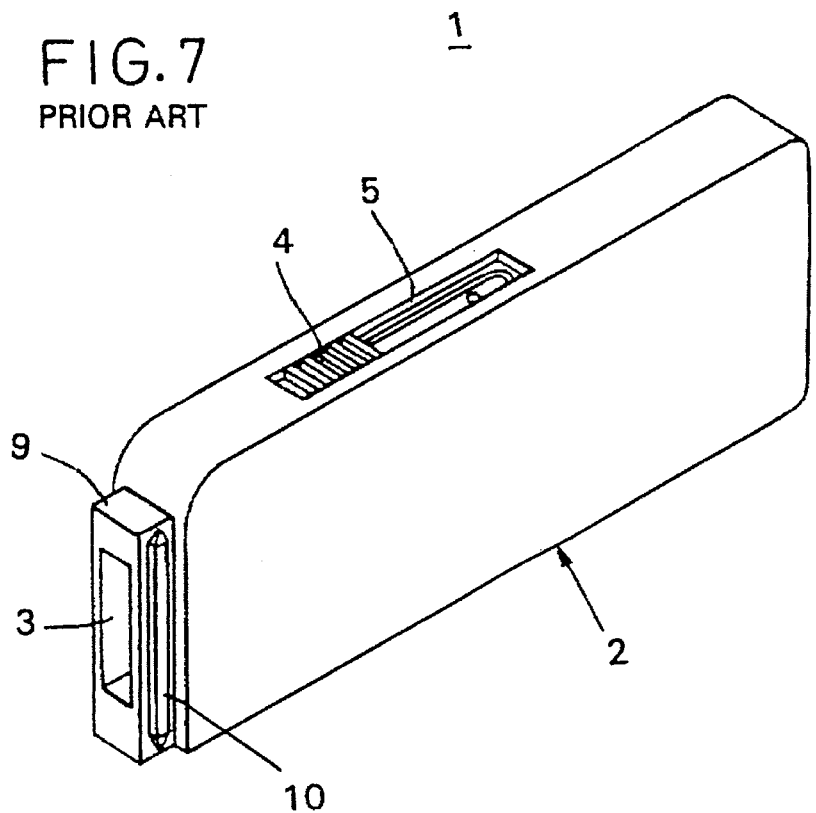
FIG. 7 is a perspective view showing the appearance of a conventional electronic parts storage cassette.

The adaptor member 24 is formed of resin, for example, like the case 2 of the conventional cassette 1. The adaptor member 24 is substantially similar to the end of the conventional case 2 shown in FIG. 7 which contains the discharge port 3. That is, the adaptor member 24 includes a discharge port 25 corresponding to the discharge port 3 shown in FIG. 7, an attaching portion 26 corresponding to the attaching portion 9, a pair of ribs 27 corresponding to the ribs 10 and a socket portion 28 for receiving the end portion of the case body member 23. The socket portion 28 may be large enough to cover substantially the whole case body member 23. It is not necessary for the adaptor member 24 to be provided with a cover and an open/close operating member 4 with which the conventional cassette 1 is provided.

Figure 3:
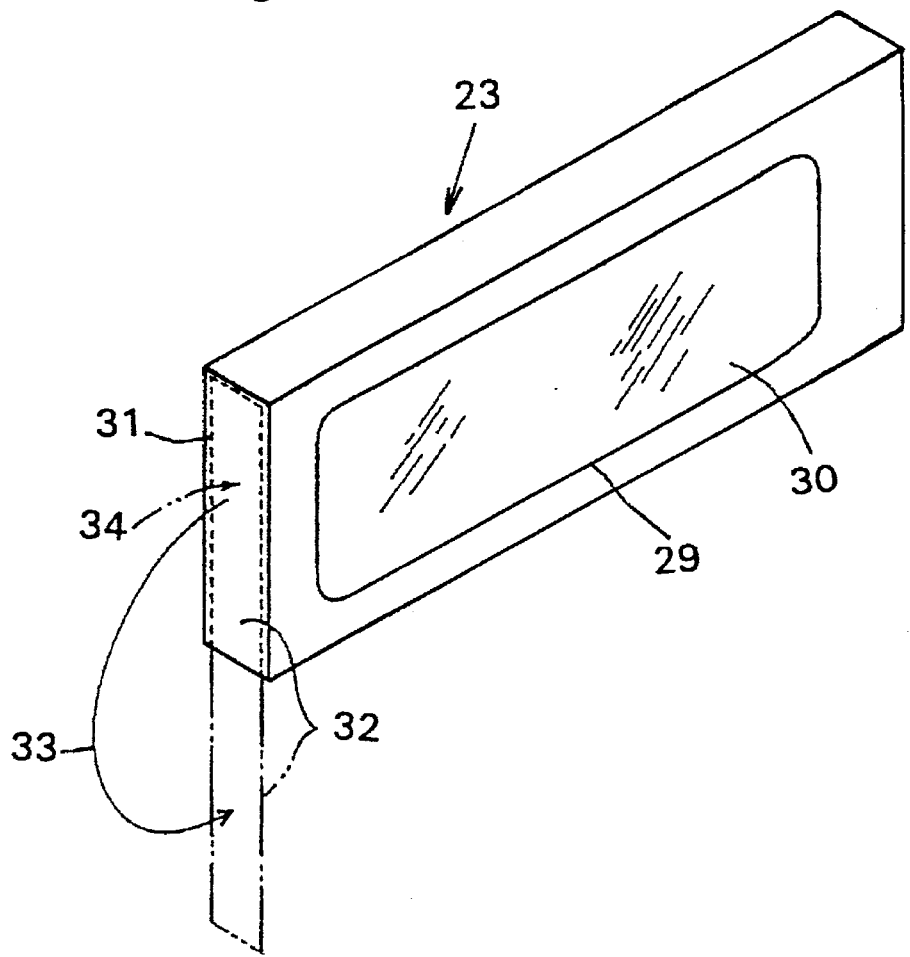
FIG. 3 is a perspective view showing a case body member included in the electronic parts storage cassette shown in FIG. 1.

The case body member 23 is, as well shown in FIG. 3, formed generally of a sheet material such as a paper, and is preferably inexpensive and disposable. A window 29 may preferably be formed in at least one of the side surfaces of the case body portion 23, and a transparent sheet 30 such as cellophane may be stretched over the window 29 so that the electronic parts in the case body member 23 can be seen from the outside and the number of remaining electronic parts can be known.

Perforations 31 are formed in one end surface of the case body member 23. A cover 32 is an area surrounded by the perforations 31. An opening 34 is formed at the end of the case body member 23 by tearing open the perforations 31 in the direction shown by an arrow 33 to open the cover 32 and bring the cover 32 into the position shown in phantom.

Figure 8:
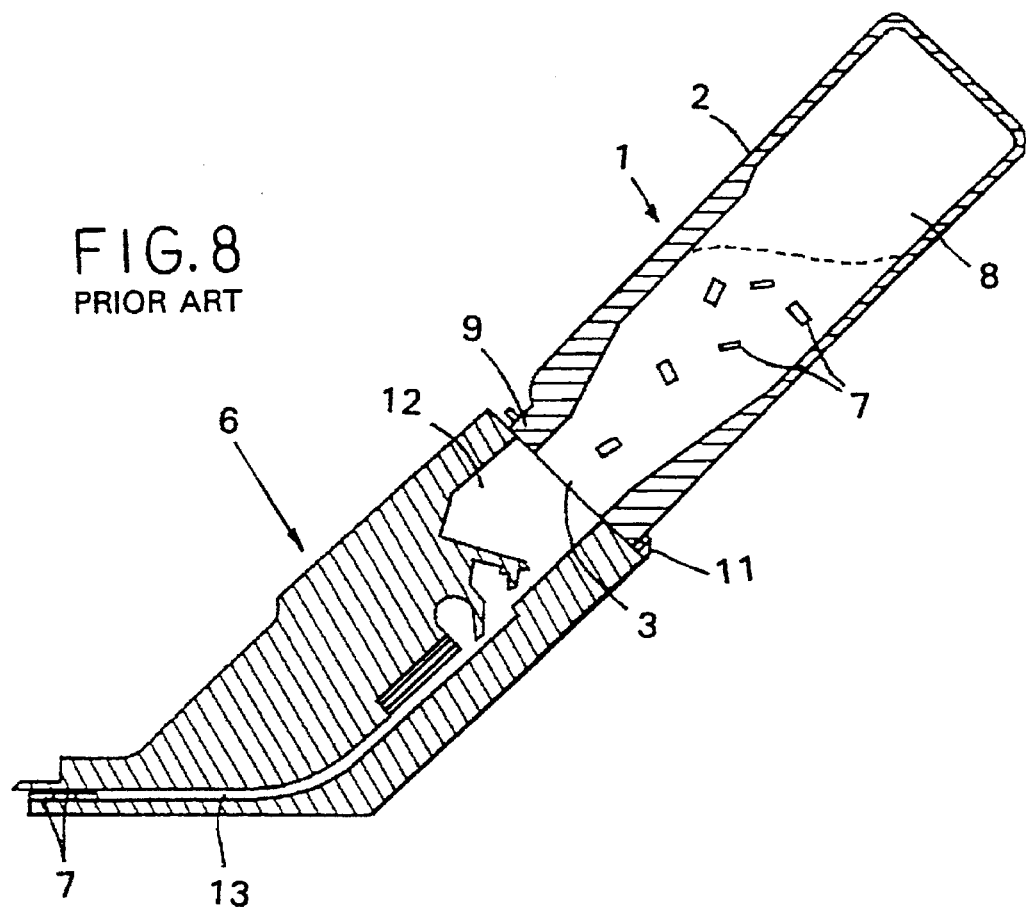
FIG. 8 is a front view showing a vertical cross-section of the electronic parts storage cassette shown in FIG. 7 when attached to a hopper of a mounting machine.

As shown in FIG. 2, by sliding the attaching portion 26 to fit the ribs 27 into the fitting portion 11 of the hopper 6, the adaptor member 24 is attached to the hopper 6. Then, the cover 32 of the case body member 23 is opened and one end of the case body member 23 is inserted into the socket portion 28 in such a way that the electronic parts contained in the case body member 23 are kept from spilling. At this time, the opening 34 formed in the case body member 23 communicates with the discharge port 25 of the adaptor member 24. Thus, as in the case of the conventional cassette 1 shown in FIG. 8, a plurality of electronic parts can be supplied from the case body member 23 into the hopper 6 through the adaptor member 24.

Upon completion of the discharge of the electronic parts from the case body member 23 as described above, the case body member 23 is removed from the adaptor member 24 and typically disposed of as it is. Then, in order to supply additional electronic parts to the hopper 6, another case body member 23 storing electronic parts is attached to the adaptor member 24.

Figure 4:
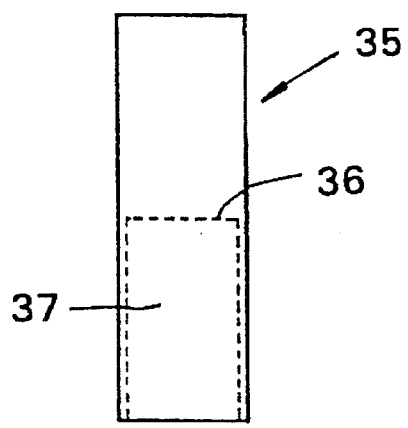
FIG. 4 is an end view showing a case body member to be used in a second embodiment of the present invention.
Figure 5:
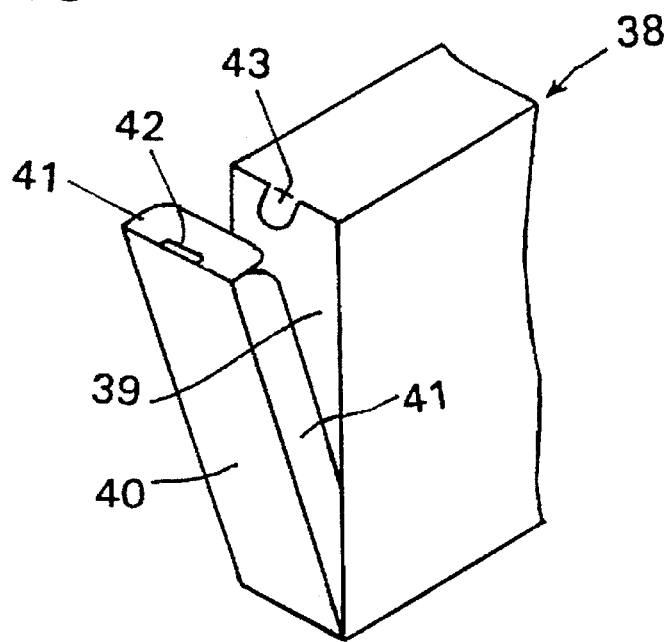
FIG. 5 is a perspective view showing an end portion of a case body member to be used in a third embodiment of the present invention.
Figure 6:
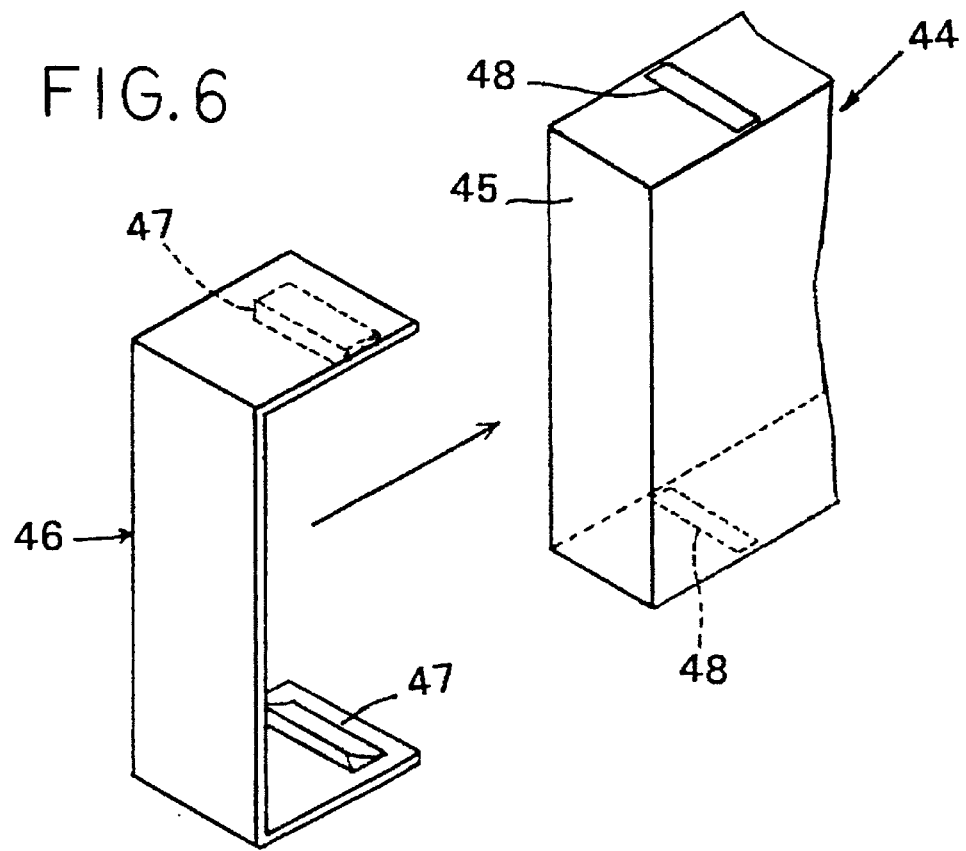
FIG. 6 is a perspective view showing an end portion of a case body member and a cover to be used in a fourth embodiment of the present invention.

FIGS. 4, 5 and 6 respectively show additional embodiments of the cassette body member.

According to a case body member 35 shown in FIG. 4, perforations 36 are formed in such a way that they surround about half of one end surface of the case body member 35, and the portion surrounded by the perforations 36 forms a cover 37. Therefore, when the cover 37 is opened, about half of the end surface is open.

In FIGS. 3 and 4, the covers 32 and 37 may also be completely separated from the remaining portions of the case body members 23 and 35, rather than remaining attached.

According to a case body member 38 shown in FIG. 5, a flap-like cover 40 is rotatable so as to close an opening 39 provided at one end of the case body member 38. The cover 40 is provided with rising walls 41 at the periphery thereof, and a slit 42 is formed in a free end thereof. On the other hand, a tongue 43 is provided on the case body member 38 at the position opposite to the slit 42. In order to close the cover 40, the rising walls 41 are inserted within the peripheral walls defining the opening 39 and then, the tongue 43 is inserted into the slit 42. This arrangement can maintain a relatively strong closure of the cover 40. After the tongue 43 is pulled out of the slit 42 to open the cover 40, the end of the case body member 38 where the opening 39 is formed is inserted into the socket portion 28 shown in FIGS. 1 and 2 of the adaptor member 24.

In the embodiment shown in FIG. 6, an opening 45 formed in one end of a case body member 44 is closed by a cover 46 which is provided as a separate member. The cover 46 is formed of, for example, resin and has a generally U-shaped cross section. The cover 46 is provided with engaging portions 47. When the engaging portions 47 are snapped into mating slots 48 formed in a case body member 44, the opening 45 is closed by the cover 46. When the cover 46 is somewhat strongly removed from the case body member 44, the opening 45 is uncovered, and in this state, the case body member 44 is attached to the adaptor member 24 shown in FIGS. 1 and 2. The cover 46 may be formed of paper in place of resin.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An electronic parts storage cassette for supplying a plurality of electronic parts to a mounting machine for mounting electronic parts, comprising:

a case body member made of a sheet material and including a storage space within the case body member for storing said plurality of electronic parts; and an adaptor member separate from the case body member, including a discharge port in communication with said storage space in said case body member for discharging said electronic parts, and an attaching portion having a configuration which is engageable with a corresponding configuration of said mounting machine, for enabling the cassette to be removably attached to the mounting machine with said discharge port directed toward the mounting machine, wherein said case body member has an opening at one end thereof, and wherein said adaptor member includes a socket portion configured for receiving the end of said case body member and said opening is formed at said end of said case body member so that said opening communicates with said discharge port.

2. An electronic parts storage cassette according to claim 1, wherein said sheet material is paper.

3. An electronic parts storage cassette according to claim 1, further comprising a plurality of electronic parts contained within said storage space.

4. An electronic parts storage cassette according to claim 1, further comprising an openable and closable cover on said one end which is removable from and reattachable to said case body member.

5. An electronic parts storage cassette according to claim 1, further comprising an openable and closable cover on said one end which is hinged on said case body member.

6. An electronic parts storage cassette according to claim 5, wherein said cover is defined by a perforation line formed in said one end of said case body member.

7. An electronic parts storage cassette according to claim 1, further comprising an openable and closable cover on said one end which is defined by a perforation line formed in said one end of said case body member.

8. A case body member for supplying a plurality of electronic parts to a mounting machine through a separate adaptor member, the adaptor member including an attaching portion having a configuration which is engageable with a corresponding configuration of said mounting machine, for enabling the cassette to be removably attached to the mounting machine, a discharge port for discharging the electronic parts, and a socket portion communicating with said discharge port, and wherein said case body member is made of a sheet material and is provided with a storage space formed inside thereof for storing a plurality of electronic parts and an opening with a closable and openable cover at one end thereof, said one end being sized and shaped to be received by said socket portion so that said opening is in communication with said discharge port.

9. A case body member according to claim 8, further comprising a plurality of electronic parts contained within said storage space.

10. A case body member according to claim 8, wherein said cover is removable from and reattachable on said case body member.

11. A case body member according to claim 8, wherein said cover is hinged on said case body member.

12. A case body member according to claim 11, wherein said cover is defined by a perforation line formed in said one end of said case body member.

13. A case body member according to claim 8, wherein said cover is defined by a perforation line formed in said one end of said case body member.

14. A case body member according to claim 8, wherein said sheet material is paper.

15. An electronic parts storage cassette for supplying a plurality of electronic parts to a mounting machine for mounting electronic parts, comprising:

an adaptor member, said adaptor member including a discharge port and an attaching portion, said attaching portion having a configuration which is engageable with a corresponding configuration of said mounting machine, for enabling the cassette to be removably attached to the mounting machine with said discharge port directed toward the mounting machine; and a case body member made of a sheet material and including a storage space within the case body member for storing said plurality of electronic parts and having an opening at one end thereof;

said adaptor member including a socket portion, said socket portion and said opening of said case body member being configured for being engaged with each other so as to bring said discharge port into communication with said storage space in said case body member, for discharging said electronic parts from said cassette through said discharge port.

16. An electronic parts storage cassette according to claim 15, wherein said sheet material is paper.

17. An electronic parts storage cassette according to claim 16, further comprising a plurality of electronic parts contained within said storage space.

18. An electronic parts storage cassette according to claim 15, further comprising a plurality of electronic parts contained within said storage space.

19. An electronic parts storage cassette according to claim 15, further comprising an openable and closable cover on said one end which is removable from and reattachable to said case body member.

20. An electronic parts storage cassette according to claim 15, further comprising an openable and closable cover on said one end which is hinged on said case body member.

21. An electronic parts storage cassette according to claim 20, wherein said cover is defined by a perforation line formed in said one end of said case body member.

22. An electronic parts storage cassette according to claim 15, further comprising an openable and closable cover on said one end which is defined by a perforation line formed in said one end of said case body member.

* * * * *